United States Patent
Chen et al.

[11] Patent Number: 5,956,587
[45] Date of Patent: Sep. 21, 1999

[54] METHOD FOR CROWN TYPE CAPACITOR IN DYNAMIC RANDOM ACCESS MEMORY

[75] Inventors: Li Yeat Chen; Ing-Ruey Liaw, both of Hsinchu, Taiwan

[73] Assignee: Vanguard International Semiconductor Corporation, Hsin-Chu, Taiwan

[21] Appl. No.: 09/024,716

[22] Filed: Feb. 17, 1998

[51] Int. Cl.[6] .............................................. H01L 21/8242
[52] U.S. Cl. ........................... 438/255; 438/634; 438/675
[58] Field of Search .................... 438/253, 255, 438/396, 398, 634, 665, 674, 675, 964

[56] References Cited

U.S. PATENT DOCUMENTS

| | | | |
|---|---|---|---|
| 5,491,103 | 2/1996 | Ahn et al. | 437/52 |
| 5,543,345 | 8/1996 | Liaw et al. | 437/52 |
| 5,545,584 | 8/1996 | Wuu et al. | 437/52 |
| 5,550,076 | 8/1996 | Chen | 437/52 |
| 5,604,146 | 2/1997 | Tseng | 437/52 |
| 5,766,995 | 6/1998 | Wu | 438/255 |
| 5,851,875 | 12/1998 | Ping | 438/255 |

*Primary Examiner*—Chandra Chaudhari
*Attorney, Agent, or Firm*—George O. Saile; Stephen B. Ackerman; William J. Stoffel

[57] ABSTRACT

A crown capacitor for a memory device is formed using (1) an important early poly plug 42 process and (2) an etch barrier layer 34. A first insulating layer 30 and an etch barrier layer are formed over device structures and the substrate 10. A node contact hole 40 is formed through the etch barrier layer 34 and the first insulating layer 30. A plug 42 is formed filling the node contact hole 40. Next, a planarizing layer 44 is formed over the etch barrier layer 34 and the plug 42. A crown hole 46 is formed in the planarizing layer 44 exposing the plug 42. A first polysilicon layer 50 is deposited over the etch barrier layer, the plug 42, and the remaining first planarizing layer 44A. A Sacrificial layer 54 is formed over the first polysilicon layer 50 thereby filling the crown hole 46. The sacrificial layer 54 and the first polysilicon layer 50 are etch back to remove the exposed portions of the first polysilicon layer 50 over the planarizing layer 44A. The sacrificial layer 54 is selectively removed thereby forming a crown shaped storage electrode 42 50.

12 Claims, 8 Drawing Sheets

METHOD FOR CROWN TYPE CAPACITOR IN DYNAMIC RANDOM ACCESS MEMORY

BACKGROUND OF INVENTION

1) Field of the Invention

This invention relates generally to the fabrication of capacitors in a DRAM cell and particularly to a method for fabricating capacitors over bit lines with large capacitance and more particularly to a method for fabricating a crown cylindrical capacitor.

2) Description of the Prior Art

Very large scale integration (VLSI) semiconductor technologies have dramatically increased the circuit density on a chip. The miniaturized devices built in and on semiconductor substrates are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation. Therefore, stacked capacitors having a three-dimensional structure have been suggested to improve cell capacitance. Such stacked capacitors include, for example double-stacked, fin-structured, cylindrical, spread-stacked, and box structured capacitors.

The following U.S. patents show related processes and capacitor structures: U.S. Pat. No. 5,543,345 (Liaw et al.), U.S. Pat. No. 5,550,076 (Chen), U.S. Pat. No. 5,604,146 (Tseng), and U.S. Pat. No. 5,491,103 (Ahn et al.). U.S. Pat. No. 5,545,584 (Wuu et al.) shows a unified contact plug process. However, many of the prior art methods require substantially more processing steps or/and planar structures which make the manufacturing process more complex and costly.

There is a challenge to develop methods of manufacturing these capacitors that minimize the manufacturing costs and maximize the device yields. In particular, there is a challenge to develop a method that minimizes the number of photoresist masking operations and to provide maximum process tolerance to maximize product yields. There is also a challenge to develop a capacitor which is not limited in size by the photolithographic techniques.

SUMMARY OF THE INVENTION

It is an object of the present invention to provide a method for fabricating a capacitor having a high density and capacitance.

It is an object of the present invention to provide a method for fabricating a DRAM having capacitor having a high density and capacitance which is low cost and simple to manufacture.

It is an object of the present invention to provide a method for fabricating a capacitor which can over come the limitations of photographic techniques and which reduces the number of masking steps.

It is an object of the present invention to provide a method for fabricating a dynamic random access memory (DRAM) having capacitor having a high density and capacitance which is low cost and simple to manufacture.

It is another object of the present invention to provide a method for fabricating a crown capacitor having Hemispherical grains (HSG) deposited on the inside of the crown so to avoid problems from the HSG strip grain inducing leakage.

To accomplish the above objectives, the present invention provides a method of manufacturing a crown capacitor for a memory device, which is characterized:

a) See FIG. 1—selectively form isolation areas 12 on the surface of a substrate 10 while leaving device areas for the fabrication of semiconductor devices;

b) form device structures 20 22 24 26 28 29 within the device areas of the substrate wherein in the device structure includes a capacitor node contact region 18 (e.g., drain region) in the substrate 10;

c) FIG. 1—form a first insulating layer 30 over the device structures and the substrate 10;

d) FIG. 2—form an etch barrier layer 34 over the first insulating layer;

e) form a node contact hole 40 through the etch barrier layer 34 and the first insulating layer 30 to expose the capacitor node contact region on the substrate;

f) FIG. 2—form a plug 42 filling the node contact hole 40 making electrical and mechanical contact with the capacitor node contact region 18;

g) FIG. 3—form a planarizing layer 44 over the etch barrier layer 34 and the plug 42;

h) form a crown hole 46 in the planarizing layer 44 exposing the plug 42 and surround portions of the etch barrier layer 34; the crown hole is defined by remaining portions of the planarizing layer 44A;

i) FIG. 4—deposit a first polysilicon layer 50 over the etch barrier layer, the plug 42, and the remaining first planarizing layer 44A partially fill the crown hole;

j) optional process—form a HSG layer 52 over the first polysilicon layer 50;

k) FIG. 5=form a sacrificial layer 54 composed of borophosphosilicate glass over the first polysilicon layer 50 thereby filling the crown hole 46;

l) remove top portions of the sacrificial layer 54 to expose the first polysilicon layer over the remain portion of the planarizing layer 44A; the top portions of the sacrificial layer 54 removed by etching back and chemical-mechanical polish;

m) remove the exposed portions of the first polysilicon layer 50 over the top the remain portion of the planarizing layer 44A;

n) selectively remove the remain portions of the sacrificial layer 54 and the planarizing layer 44A thereby forming a crown shaped storage electrode 42 50; and o) form a capacitor dielectric layer 56 and a top electrode 58 over the crown shaped storage electrode 42 50.

Preferably, the first insulating layer composed of a material selected from the group consist of silicon oxide, BPSG, and silicon oxide formed by a Sub atmospheric-oxide process.

Preferably, the etch barrier layer is composed silicon nitride, silicon oxynitride or TEOS oxide, and the etch barrier layer 34 has a thickness in a range of between about 50 and 200 Å

Preferably, the node contact hole 40 has an open dimension in a range of between about 0.18 and 0.35 μm.

Preferably, the plug 42 is composed of doped polysilicon; the plug formed by depositing a layer of doped polysilicon with a thickness in a range of between about 3000 and 4500 Å and etching back the layer of doped polysilicon.

Preferably, the planarizing layer 44 is composed of borophosphosilicate glass, silicon oxide, or spin-on-glass, and has a thickness in a range of between about 7000 and 13,000 Å.

Preferably, the crown hole 46 has an open dimension in a range of between about 0.3 and 0.8 μm.

Preferably, the first polysilicon layer 50 composed of doped polysilicon and has a thickness in a range of between about 300 and 500 Å.

Preferably, the Hemispherical grains (HSG) layer has a thickness in a range of between about 300 and 700 Å.

Preferably, the sacrificial layer 54 is formed of borophosphosilicate glass, silicon oxide, polymer or photo resistant material, and the sacrificial layer has a thickness in a range of between about 4500 and 10,000 Å.

The present invention achieves these benefits in the context of known process technology. However, a further understanding of the nature and advantages of the present invention may be realized by reference to the latter portions of the specification and attached drawings. The invention has the following benefits:

① The etch barrier layer 34 protects the underlying first insulating layer 30 from the selective etches for forming the plug 42 (See FIG. 2) and the sacrificial layer 44A etchback ( See FIGS. 6 and 7). Moreover, the etch barrier layer 34 is preferably composed of silicon oxynitride which reduces stress and improves yields. The etch barrier layer 34 also has a high etch selectivity than an oxide such as TEOS oxide.

② The polysilicon plug 42 process improves the photolithography accuracy, especially in the 0.25 μM and smaller processes, by gaining depth of focus (DOF) margin by reducing topography. A conventional plug hole would be defined after the crown hole 46 etch (see FIG. 4). The polysilicon plug 42 process (See FIG. 2) comprises forming a polysilicon layer over the etch barrier layer 34 and etching back the polysilicon layer.

③ The crown cylinder electrode 50 having Hemispherical grains (HSG) 52 only on the inside surfaces eliminates HSG grains that could falls from the outside crown walls.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a crown capacitor over a bit line. Key features are the etch barrier layer 34 and the early plug 42 formation process.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not be described in detail in order to not unnecessarily obscure the present invention.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips. It should be also understood that the figures show N-MOS devices, but P-MOS devices or a combination of N and P-MOS devices can be simultaneously formed on the substrate.

The method for manufacturing a crown capacitor for a memory device begins by selectively forming isolation areas 12 on the surface of a substrate 10 while leaving device areas of fabrication of semiconductor devices.

Substrate 10 is understood to possibly include a semiconductor wafer, active and passive devices formed within the wafer and layers formed on the wafer surface. The term "substrate" is mean to include devices formed within a semiconductor wafer and the layers overlying the wafer.

Figure 1:
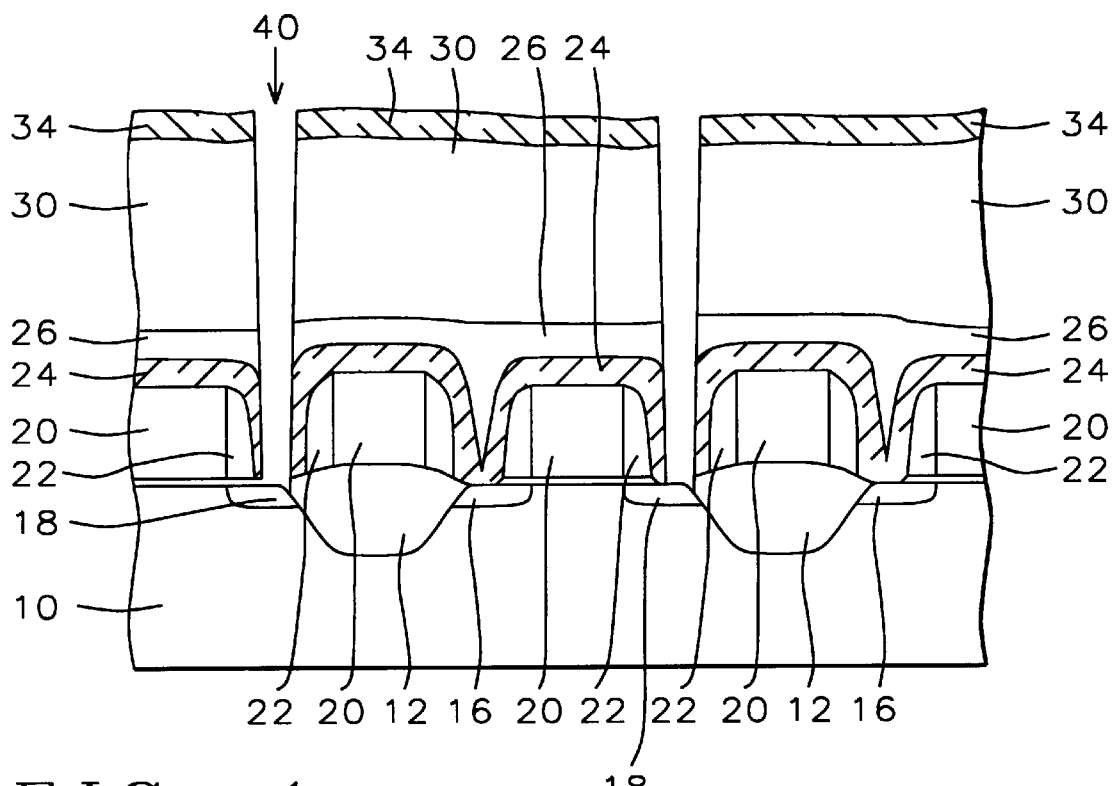
FIGS. 1 through 7 are cross sectional views for illustrating a method for manufacturing a crown capacitor according to the present invention.

FIG. 1 illustrates device structures 20 22 24 26 formed within the device areas of the substrate wherein in the device structure includes a capacitor node contact region 18 (e.g., source region) which the substrate 10.

The devices can comprise gate structures 20, spacers 22, source 18 and drain 16 regions, a first isolation layer 24, and a second isolation layer 26.

The gate structures 20 preferably comprise a gate oxide layer, a polysilicon/polycide layer, and a top gate isolation layer (all shown as layer 20). Source 18 and drain regions 16 are formed in the substrate using conventional processes. One of these doped regions is the capacitor node contact region where the bottom electrode of the capacitor will contact. The gate structure is part of the MOS memory device being formed. Preferably spacers 22 are formed on the sidewalls of the gate structure 20.

The first isolation layer 24 is preferably composed of silicon oxide formed by a TetraEthylOrthoSilane (TEOS) process and preferably has a thickness in a range of between about 300 and 2000 Å.

The second isolation layer 26 is preferably composed of oxide, borophosphosilicate glass (BPSG), phosphosilicate glass, borosilicate glass (BSG), and preferably has a thickness in a range of between about 2000 and 4500 Å.

The invention forms a capacitor over bit line (COB) structure. A bit line contact hole 28 (shown in top view FIG. 9) is preferably formed through first isolating layer 30 and second isolation layer that exposes the underlying bit lines. Next, the bit line contact hole 28 is filled with a polysilicon from a second polysilicon layer to form a bit line plug and bit line 29. This forms a capacitor over Bitline (COB) DRAM structure. This structure is more dense and allows more capacitor area.

As shown in FIG. 1, a first insulating layer 30 is formed over the second isolation layer 26, device structures, bit lines and the substrate 10. The first insulating layer is preferably composed of silicon oxide, BPSG, silicon oxide formed by a SA-oxide process, and is most preferably composed of borophosphosilicate glass (BPSG). The first insulation layer preferably has a thickness in a range of between about 4500 and 6000 Å.

Figure 2:
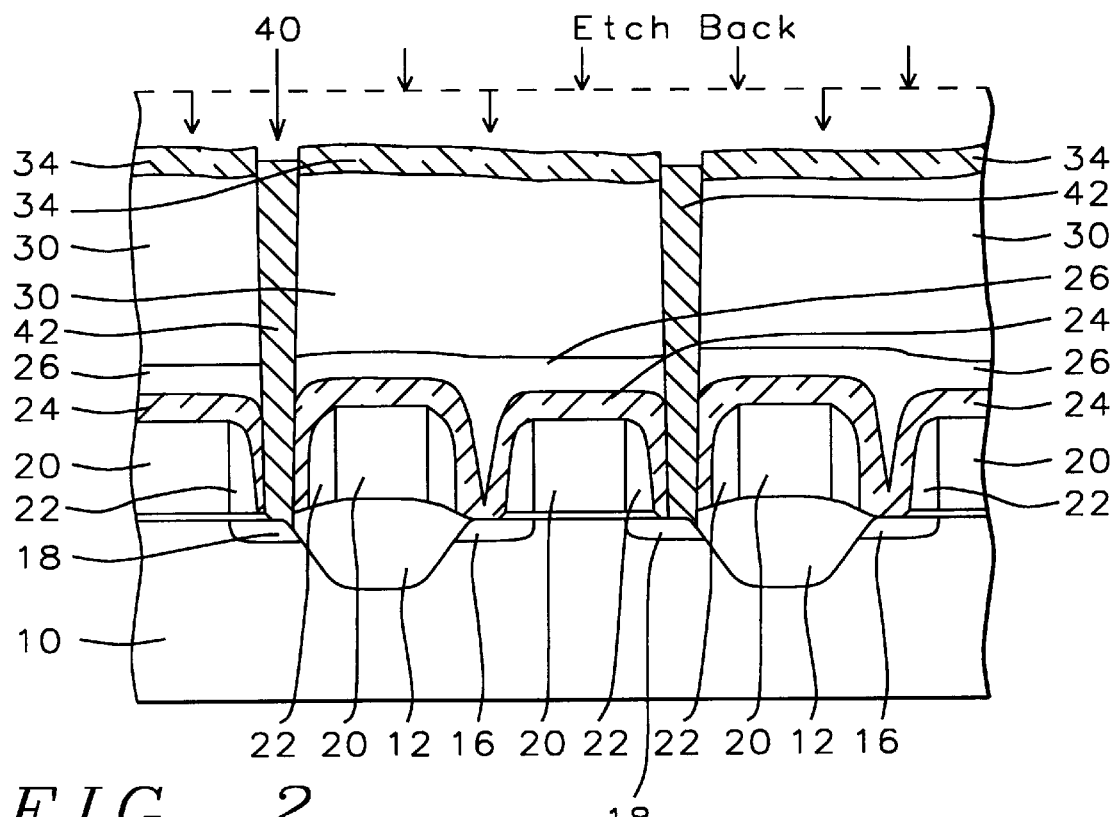

As shown in FIG. 2, an etch barrier layer 34 is formed over the first insulating layer 30. The etch barrier layer 34 is preferably composed of silicon nitride (SiN), silicon oxynitride, phosphosilicate glass and TEOS oxide, and more preferably is SiN or silicon oxynitride and most preferably formed of SiN. The etch barrier layer 34 composed of SiN or Silicon oxynitride preferably has a thickness in a range of between about 55 and 200 Å. The etch barrier layer 34 composed of TEOS or PSG preferably has a thickness in a range of between about 100 and 300 Å.

Formation Of Node Contact Hole 40 And Poly Plug 42 Before Crown 50B

In a key step, a node contact hole 40 is formed through to the etch barrier layer 34 and the first insulating layer 30 to expose the capacitor node contact region 18 on the substrate 10. The node contact hole 40 preferably has an open dimension in a range of between about 0.18 and 0.35 $\mu$m. The formation of the node contact hole this early in the process is a significant benefit as the photo process is improved compared to the inventor's former process where the node contact hole was formed after the formation of crown hole 46 in the planarizing layer 44. See FIG. 4. In addition the etch barrier layer 34 is critical the photo process for 0.25 $\mu$m products and below.

Referring to FIG. 2, a plug 42 is formed filling the node contact hole 40 making electrical and mechanical contact with the capacitor node contact region 18. The plug 42 is preferably composed of doped polysilicon. The plug is preferably formed by depositing a layer of doped polysilicon with a thickness in a range of between about 3000 and 4000 Å; and etching back or chemical-mechanical polishing back the layer of doped polysilicon.

The invention's polysilicon plug 42 process can gain more (DOF) depth of focus margin in photo of 0.25 $\mu$M process. The polysilicon plug 42 process (See FIG. 2) comprises forming a polysilicon layer over the etch barrier layer 34 and etching back the polysilicon layer). In contrast, the conventional method of forming the node contact is to etch through layers 30 and 44 at the same time.

Figure 3:
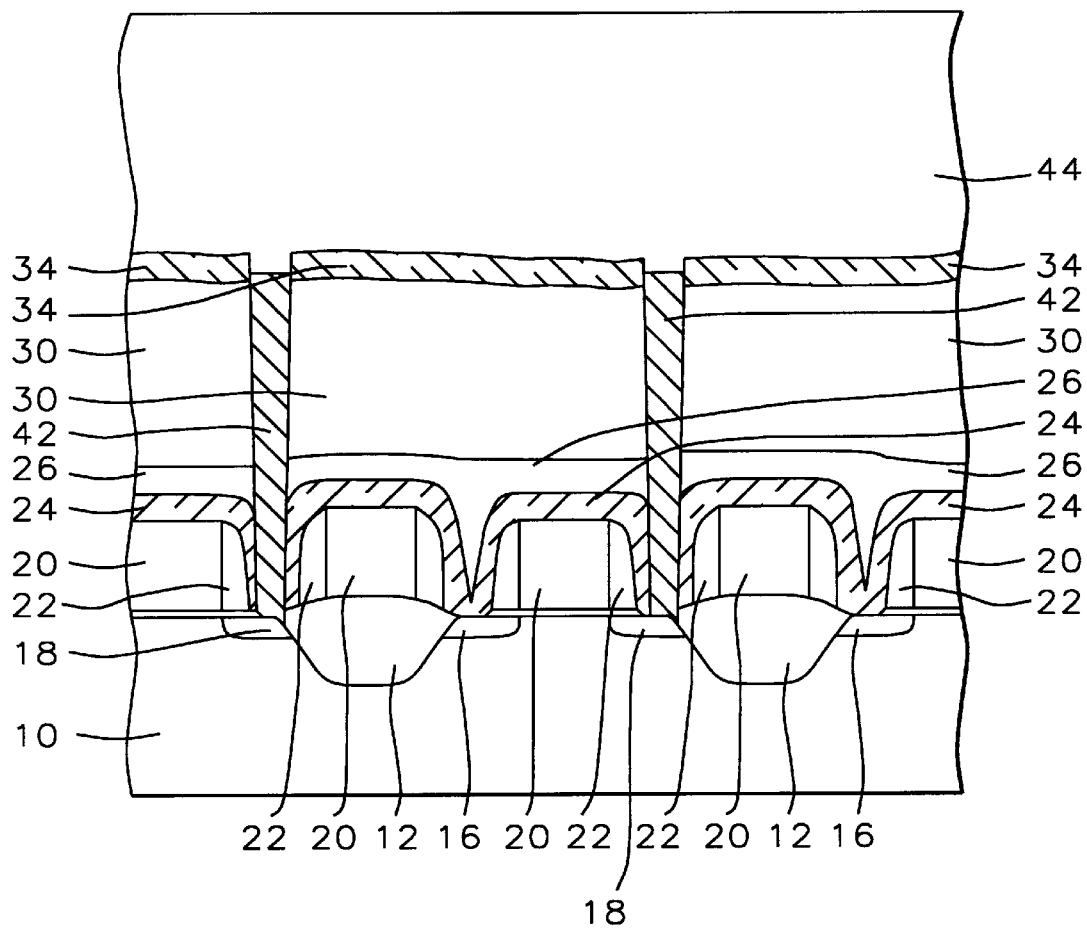

Turning to FIG. 3, a planarizing layer 44 is formed over the etch barrier layer 34 and the plug 42. The planarizing layer 44 is preferably composed of borophosphosilicate glass (BPSG), silicon oxide, and spin-on-glass (SOG), and is most preferably formed of BPSG and preferably has a thickness in a range of between about 7000 and 13000 Å.

Figure 4:
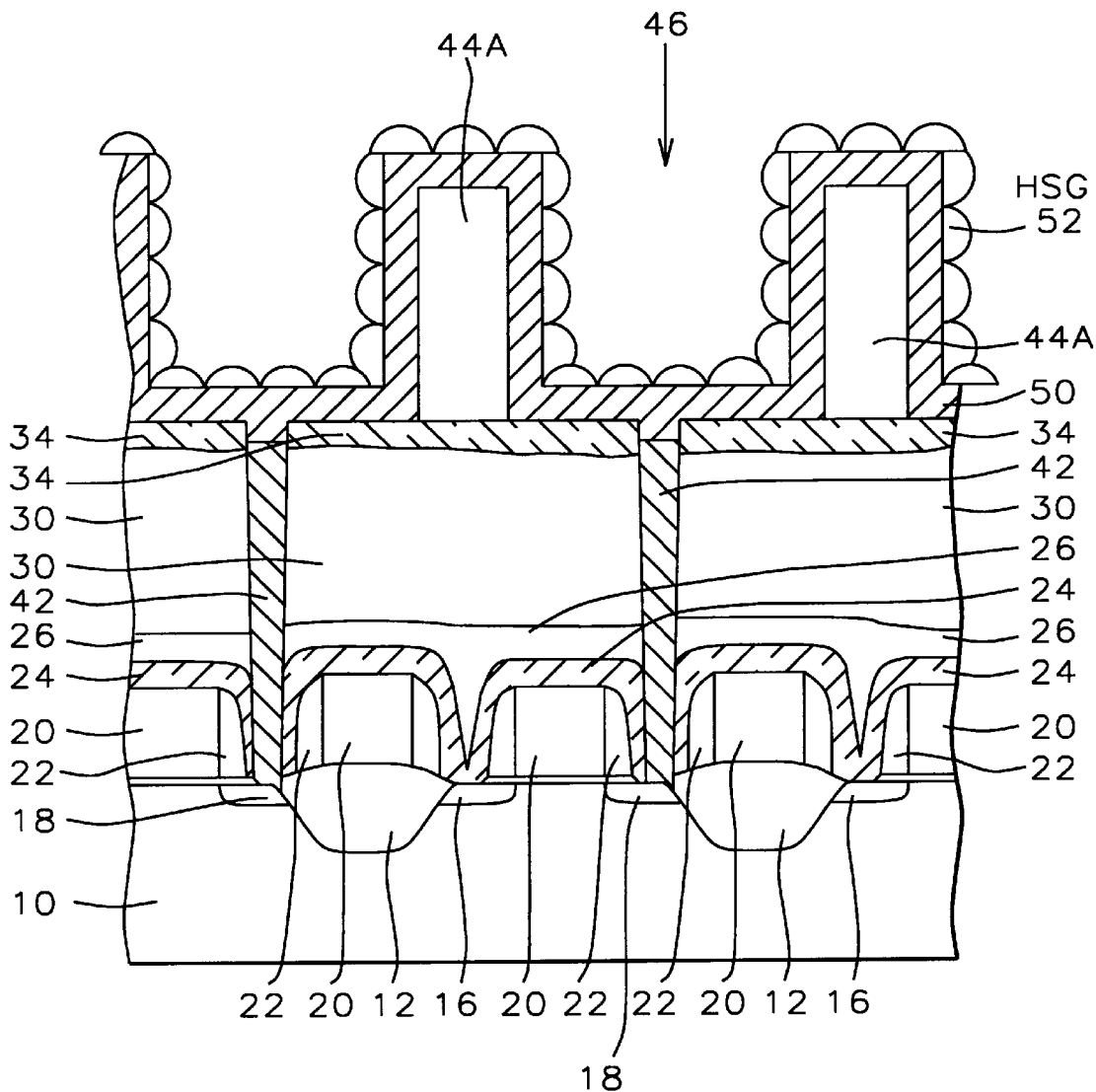

FIG. 4 shows a crown hole 46 is formed in the planarizing layer 44 exposing the plug 42 and surrounding portions of the etch barrier layer 34. The crown hole 46 is defined by remaining portions of the planarizing layer 44A. The crown hole 46 preferably has an open dimension in a range of between about 0.3 and 0.8 $\mu$m.

FIG. 4 also shows a first conductive layer (e.g., first polysilicon layer) 50 formed over the etch barrier layer, the plug 42, and the remaining portions of the first planarizing layer 44A partially filling the crown hole 46. The first conductive layer (e.g., first polysilicon layer 50) can be composed of doped polysilicon and having a thickness in a range of between about 300 and 500 Å. Later in the process HSG grains can be formed over the first conductive layer 50 formed of polysilicon. In an alternate, the first conductive layer 50 is composed of two layers: a first tungsten (W) layer and a overlying titanium nitride (TiN) layer.

Figure 8:
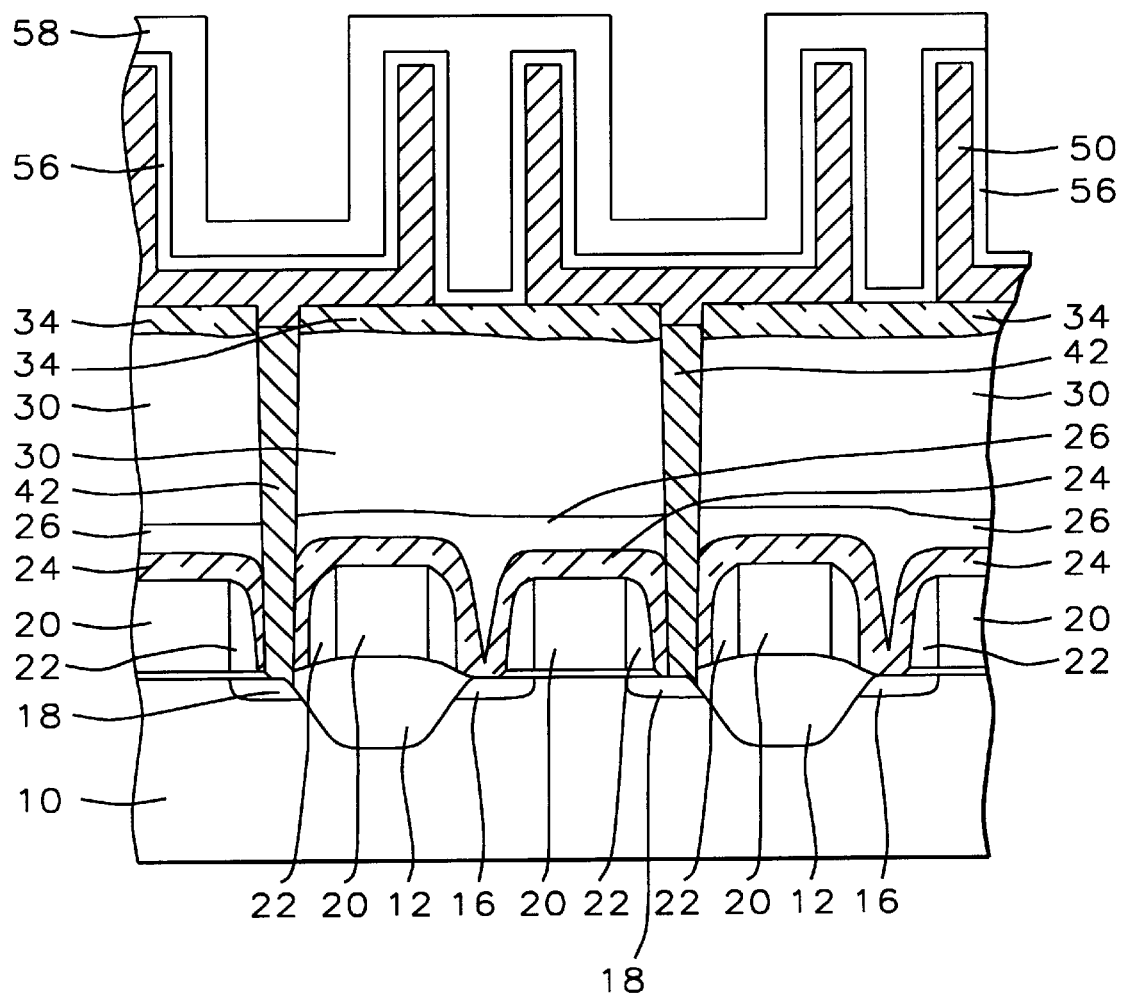
FIG. 8 is a cross sectional view for illustrating an embodiment of the invention for manufacturing a crown capacitor without the Hemispherical grains (HSG) layer 52 according to the present invention.

FIG. 4 shows a preferred embodiment of the invention. The first conductive layer is comprised of two layers, a doped polysilicon layer 50 and a HSG layer 52. The HSG layer 52 is an optional process. FIG. 8 shows the capacitor of the invention formed without the HSG layer 52. In the optional process, a hemispherical silicon grain (HSG) layer 52 is formed over the first polysilicon layer 50 to increase the surface area of the bottom electrode. The HSG layer preferably has a thickness (or diameter) in a range of between about 300 and 700 Å.

Figure 5:
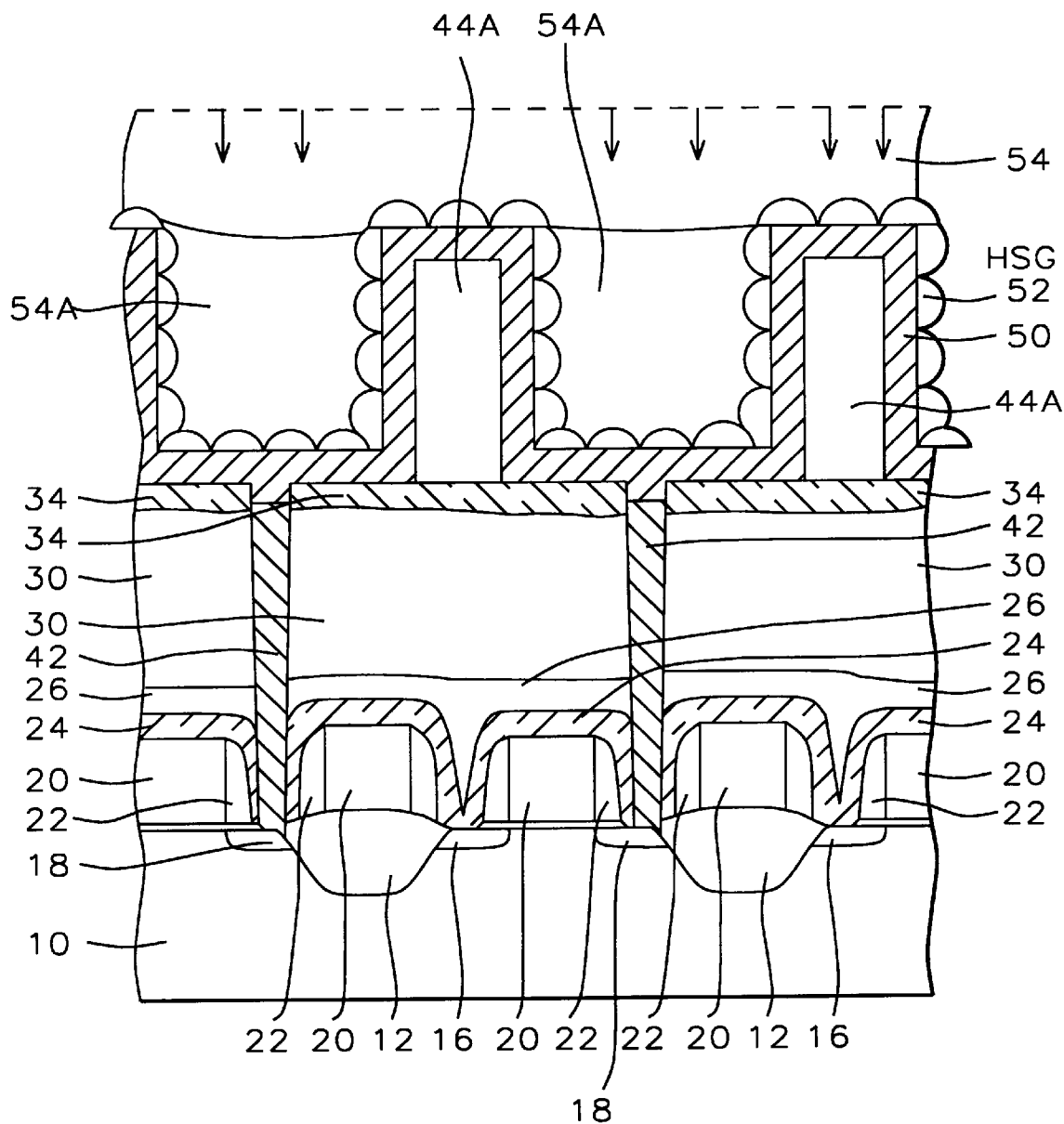

As shown in FIG. 5, a sacrificial layer 54 is formed over the first polysilicon layer 50 thereby filling the crown hole 46. The sacrificial layer 54 is preferably composed of borophosphosilicate glass, silicon oxide or a photo resistant polymer, and most preferably composed of a photo resistant polymer. The sacrificial layer 54 preferably has a thickness in a range of between about 4500 and 10,000 Å.

Still referring to FIG. 5, the sacrificial layer 54A is next etched back to expose the first polysilicon layer 50 (and the HSG layer 52 if present) over the top surface of the remaining portions of the planarizing layer 44A. The etch-back is preferably a dry etch. Alternately, the sacrificial layer can be chemical-mechanical polished back.

Figure 6:
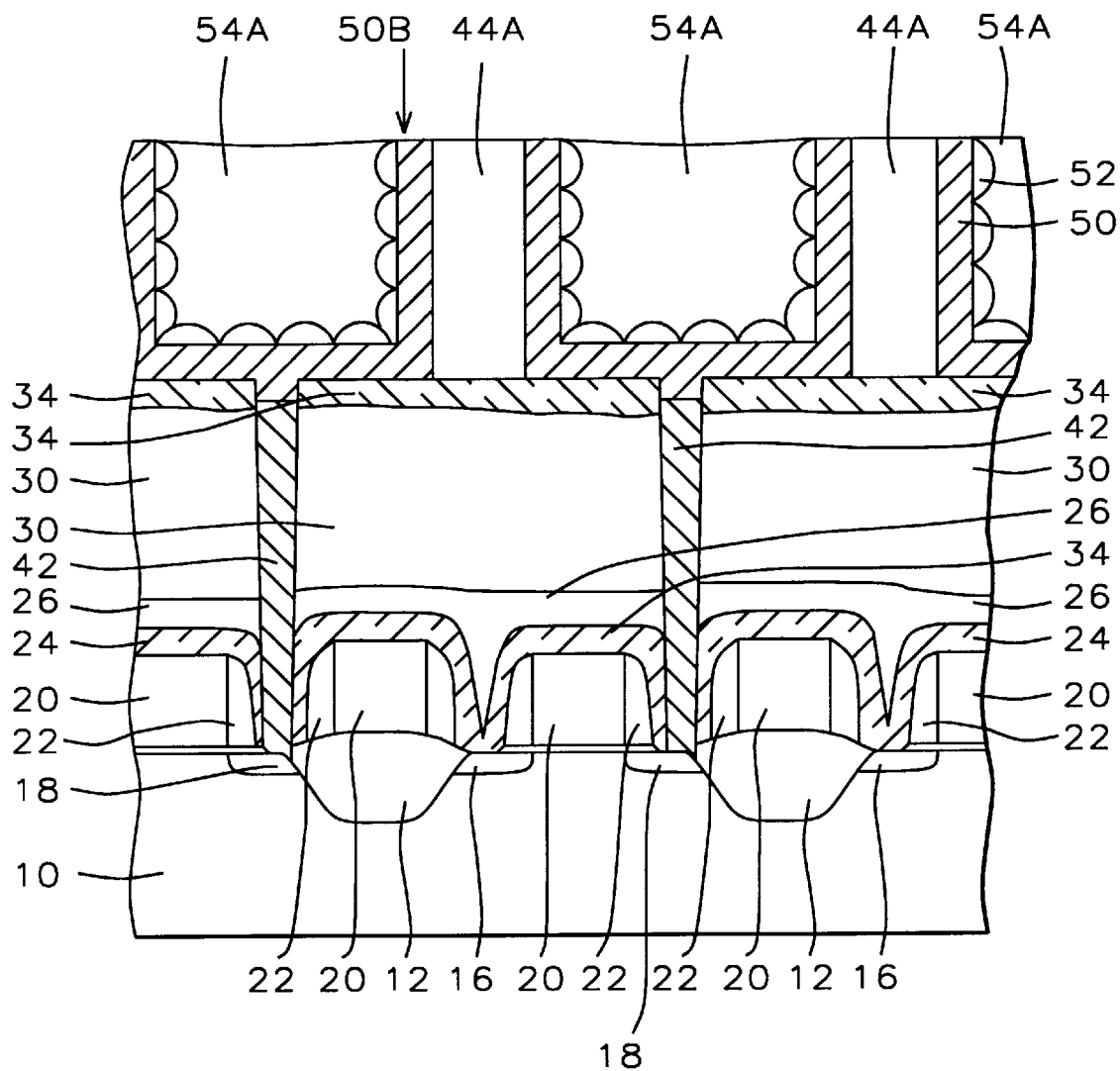

Referring to FIG. 6, the etch back or chemical-mechanical polish (CMP) continues. The top portions first polysilicon layer 50 (and the HSG layer 52 if present) are removed for over the top the remaining portion of the planarizing layer 44A. The remaining layer 50 forms the top cylinder of the crown of the bottom electrode. The top 50B of the first conductive layer is exposed as shown. Also see top down view FIG. 9.

Figure 7:
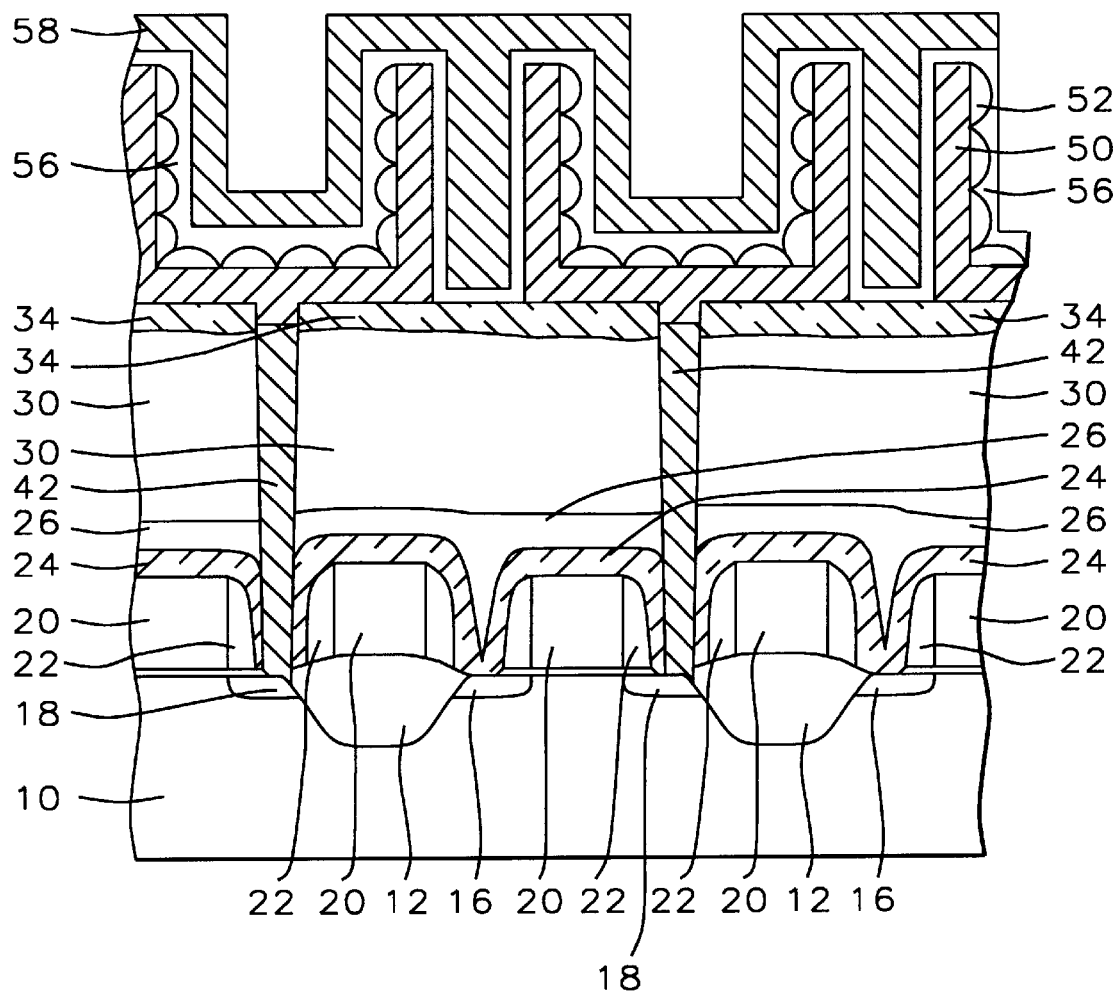

Referring to FIG. 7, the sacrificial layer 54 and remaining portions of the first planarizing layer 44A are selectively removed thereby forming a crown shaped storage electrode 42 50. The layers 54 44A are preferably removed using a HF dip etch. $H_2SO_4$ and $H_2O_2$ and $NH_4OH$ are preferably used remove photo resistant residue.

An important feature of the invention is the etch barrier layer 34, preferably formed of silicon oxynitride ($Si_xO_yN_z$) that protects the underlying first insulating layer 30 form the selective etch (e.g., vapor HF without water vapor). Moreover, the etch barrier layer is preferably composed of silicon oxynitride which significantly reduces stress and improves yields.

Still referring to FIG. 7, a capacitor dielectric layer 56 and a top electrode 58 are formed over the crown shaped storage electrode 42 50 to complete the fabrication of the dynamic random access memory (DRAM) cell. The capacitor dielectric layer is typically composed of layers of Silicon nitride and silicon oxide (NO), or ONO. In making the ONO dielectric, the first or bottom silicon oxide (O) layer is usually a native oxide grown to thickness of about 15 Å. The silicon nitride layer (N) is formed by LPCVD to give a resulting thickness of between about 80 and 200 Å,. The top silicon oxide (O) layer may be formed in an oxidation furnace. The total ONO thickness is preferably in the order of between about 100 and 250 Å.

The top plate electrode 58 is preferably formed by depositing an in-situ doped polysilicon layer by LPCVD (Low pressure chemical vapor deposition). The top plate electrode preferably has a thickness in a range of between about 1000 and 2000 Å. Alternately, the top plate electrode can be formed of TiN and W layers.

Figure 9:
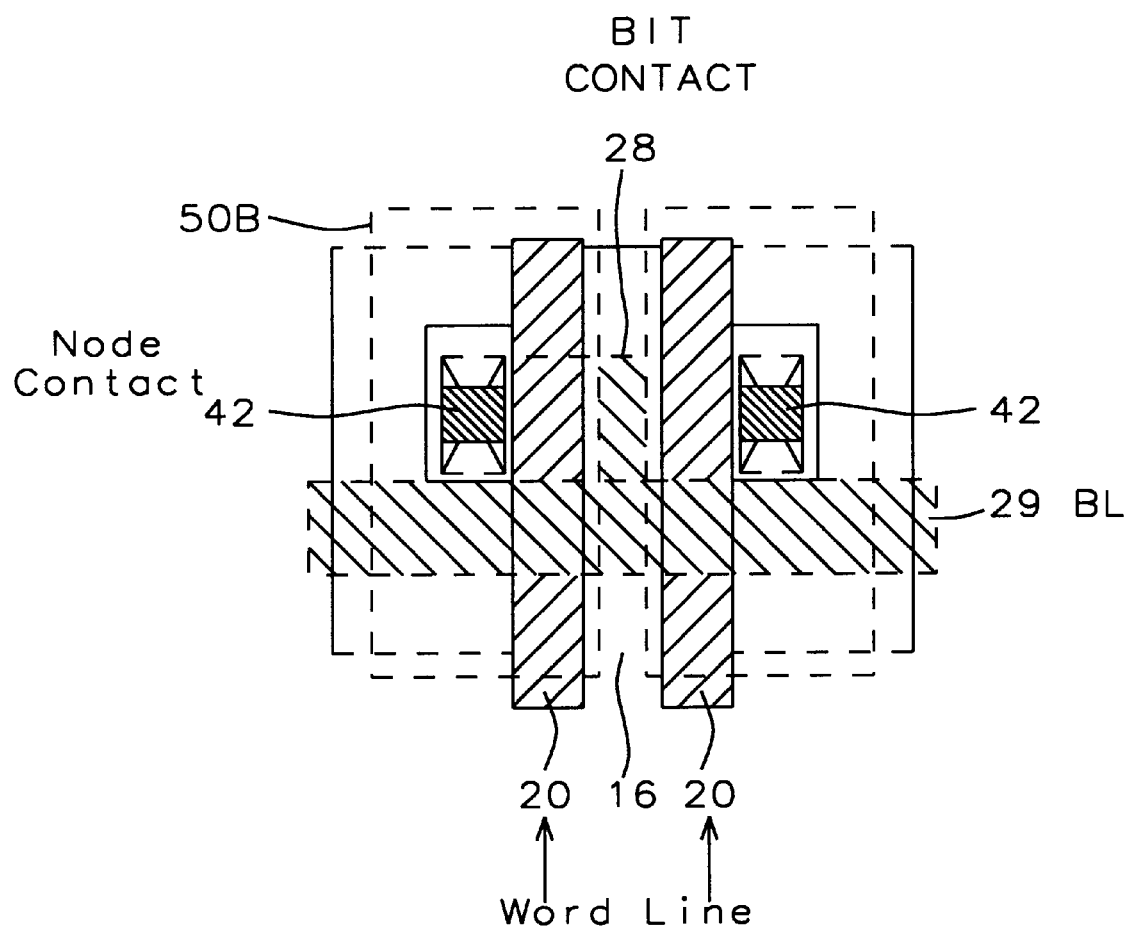
FIG. 9 is a top plan view for illustrating a method for manufacturing a crown capacitor of a semiconductor memory device according to the present invention.

FIG. 9 shows a top down view of the crown capacitor of the present invention.

The invention provides many benefits over the prior art for forming a sub 0.25 µm process capacitor.

① The etch barrier layer 34 protects the underlying first insulating layer 30 from the selective etches for forming the plug 42 (See FIG. 2) and the sacrificial layer 44A etchback (See FIGS. 6 and 7). Moreover, the etch barrier layer 34 is preferably composed of silicon oxynitride which reduces stress and improves yields. The etch barrier layer 34 also has a high etch selectivity than an oxide such as TEOS oxide.

② The polysilicon plug 42 process improves the photolithography accuracy, especially in the 0.25 µM and smaller processes, by gaining depth of focus (DOF) margin by reducing topography. The polysilicon plug 42 process (See FIG. 2) comprises forming a polysilicon layer over the etch barrier layer 34 and etching back the polysilicon layer). The formation of the node contact hole this early in the process is a significant benefit as the photo process is improved compared to the inventor's former process where the node contact hole 40 was formed after the formation of crown hole 46 in the planarizing layer 44. See FIG. 4. If the node contact hole 40 was formed after the planarizing layer 44 was formed, the photo depth of focus (DOF) would decrease the photo precision. In addition, the etch barrier layer 34 is critical the photo process for 0.25 µm products and below.

③ The crown capacitor having HSG only on the inside surfaces eliminates HSG grains that could falls from the outside crown walls 50.

④ The sacrificial layer 54 can be formed of a photo resistant material, a polymer, or borophosphosilicate glass.

It should be recognized that many publications describe the details of common techniques used in the fabrication process of integrate circuit component. See, e.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology, Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a crown capacitor for a memory device, comprising the steps of:
   a) selectively forming isolation areas on the surface of a substrate while leaving device areas of fabrication of semiconductor devices;
   b) forming device structures within said device areas of said substrate wherein in said device structure includes a capacitor node contact region in said substrate;
   c) forming a first insulating layer over said device structures and said substrate;
   d) forming an etch barrier layer over said first insulating layer;
   e) forming a node contact hole through to said etch barrier layer and said first insulating layer to expose said capacitor node contact region on said substrate;
   f) forming a plug filling said node contact hole making electrical and mechanical contact with said capacitor node contact region;
   g) forming a planarizing layer over said etch barrier layer and said plug;
   h) forming a crown hole in said planarizing layer exposing said plug and surrounding portions of said etch barrier layer; said crown hole is defined by remaining portions of said planarizing layer;
   i) depositing a first polysilicon layer over said etch barrier layer, said plug, and the remaining planarizing layer partially filling said crown hole;
   j) forming a sacrificial layer over said first polysilicon layer thereby filling said crown hole;
   k) removing top portions of said sacrificial layer to expose said first polysilicon layer over said remaining portion of said planarizing layer; said top portions of said sacrificial layer removed by a process selected from the group consisting of etching back and chemical-mechanical polish;
   l) removing the exposed portions of said first polysilicon layer over the top said remaining portion of said planarizing layer;
   m) selectively removing the remaining portions of said sacrificial layer and said planarizing layer thereby forming a crown shaped storage electrode; and
   n) forming a capacitor dielectric layer and a top electrode over said crown shaped storage electrode.

2. The method of claim 1 wherein said first polysilicon layer is comprised of two layers, a doped polysilicon layer and a Hemispherical grains (HSG) layer.

3. The method of claim 1 wherein devices comprise gate structures, spacers, first isolation layer preferably composed of silicon oxide formed by a TetraEthylOrthoSilane (TEOS) process, a second isolation layer preferably composed of silicon oxide, borophosphosilicate glass, phosphosilicate glass and borosilicate glass (BSG); and a bit line contact and bit line.

4. The method of claim 1 wherein said first insulating layer composed of a material selected from the group consisting of silicon oxide, borophosphosilicate glass, and silicon oxide formed by a Sub atmospheric-oxide process.

5. The method of claim 1 wherein said node contact hole has an open dimension in a range of between about 0.18 and 0.35 μm.

6. The method of claim 1 wherein said plug is composed of doped polysilicon; said plug formed by depositing a layer of doped polysilicon with a thickness in a range of between about 3000 and 4500 Å and etching back said layer of doped polysilicon.

7. The method of claim 1 wherein said planarizing layer composed of a material selected from the group consisting of borophosphosilicate glass, silicon oxide, and spin-on-glass, and a thickness in a range of between about 7000 and 13,000 Å.

8. The method of claim 1 wherein said crown hole having an open dimension in a range of between about 0.3 and 0.8 μm.

9. The method of claim 1 wherein said first polysilicon layer composed of doped polysilicon and having a thickness in a range of between about 300 and 500 Å.

10. The method of claim 1 wherein said HSG layer having a thickness in a range of between about 300 and 700 Å.

11. The method of claim 1 wherein said sacrificial layer is formed of a material selected from the group consisting of BPSG, silicon oxide, polymer, and photo resistant material, and said sacrificial layer having a thickness in a range of between about 4500 and 10,000 Å.

12. A method for manufacturing a crown capacitor for a memory device, comprising the steps of:
   a) selectively forming isolation areas on the surface of a substrate while leaving device areas of fabrication of semiconductor devices;
   b) forming device structures within said device areas of said substrate wherein in said device structure includes a capacitor node contact region in said substrate;
      (1) devices comprise gate structures, spacers, a first isolation layer composed of silicon oxide formed by a TetraEthylOrthoSilane (TEOS) process, a second isolation layer composed of silicon oxide, a bit line contact and bit line;
   c) forming a first insulating layer over said device structures and said substrate;
      (1) said first insulating layer composed of a material selected from the group consisting of silicon oxide, BPSG, and silicon oxide formed by a Sub atmospheric-oxide process;
   d) forming an etch barrier layer over said first insulating layer;
      (1) said etch barrier layer composed of a material selected from the group consisting of silicon nitride, silicon oxynitride and TEOS oxide, and said etch barrier layer having a thickness in a range of between about 50 and 200 Å;
   e) forming a node contact hole through to said etch barrier layer and said first insulating layer to expose said capacitor node contact region on said substrate;
      (1) said node contact hole has an open dimension in a range of between about 0.18 and 0.35 μm;
   f) forming a plug filling said node contact hole making electrical and mechanical contact with said capacitor node contact region;
      (1) said plug composed of doped polysilicon; said plug formed by depositing a layer of doped polysilicon with a thickness in a range of between about 3000 and 4500 Å and etching back said layer of doped polysilicon;
   g) forming a planarizing layer over said etch barrier layer and said plug;
      (1) said planarizing layer composed of a material selected from the group consisting of borophosphosilicate glass, silicon oxide, and spin-on-glass, and a thickness in a range of between about 7000 and 13,000 Å;
   h) forming a crown hole in said planarizing layer exposing said plug and surrounding portions of said etch barrier layer; said crown hole is defined by remaining portions of said planarizing layer;
      (1) said crown hole having an open dimension in a range of between about 0.3 and 0.8 μm;
   i) depositing a first polysilicon layer over said etch barrier layer, said plug, and the remaining planarizing layer partially filling said crown hole;
      (1) said first polysilicon layer composed of doped polysilicon and having a thickness in a range of between about 300 and 500 Å;
   j) forming a Hemispherical grains (HSG) layer over said first polysilicon layer;
      (1) said Hemispherical grains (HSG) layer having a thickness in a range of between about 300 and 700 Å;
   k) forming a sacrificial layer over said first polysilicon layer thereby filling said crown hole;
      (1) said sacrificial layer is formed of a material selected from the group consisting of BPSG, silicon oxide, polymer and photo resistant material, and said sacrificial layer having a thickness in a range of between about 4500 and 10,000 Å;
   l) removing top portions of said sacrificial layer to expose said first polysilicon layer over said remaining portion of said planarizing layer; said top portions of said sacrificial layer removed by a process selected from the group consisting of etching back and chemical-mechanical polish;
   m) removing the exposed portions of said first polysilicon layer over the top said remaining portion of said planarizing layer;
   n) selectively removing the remaining portions of said sacrificial layer and said planarizing layer thereby forming a crown shaped storage electrode; and
   o) forming a capacitor dielectric layer and a top electrode over said crown shaped storage electrode.

* * * * *